United States Patent
Hwang et al.

(10) Patent No.: US 9,608,575 B2
(45) Date of Patent: Mar. 28, 2017

(54) SIGNAL AMPLIFYING CIRCUIT WITH NOISE SUPPRESSION FUNCTION

(71) Applicant: PixArt Imaging Inc., Hsin-Chu (TW)

(72) Inventors: Hsiang-Wei Hwang, Hsin-Chu (TW); Jui-Te Chiu, Hsin-Chu (TW)

(73) Assignee: PixArt Imaging Inc., Hsin-Chu (TW)

( * ) Notice: Subject to any disclaimer, the term of this patent is extended or adjusted under 35 U.S.C. 154(b) by 0 days.

(21) Appl. No.: 14/931,836

(22) Filed: Nov. 3, 2015

(65) Prior Publication Data

US 2017/0019073 A1    Jan. 19, 2017

(30) Foreign Application Priority Data

Jul. 14, 2015 (TW) .............................. 104122670 A

(51) Int. Cl.
*H03F 1/02* (2006.01)
*H03F 1/26* (2006.01)
*H03F 3/217* (2006.01)

(52) U.S. Cl.
CPC ............. *H03F 1/26* (2013.01); *H03F 3/2171* (2013.01); *H03F 2200/351* (2013.01); *H03F 2200/372* (2013.01)

(58) Field of Classification Search
CPC .................................... H03F 1/02; H03F 3/45
USPC .................................................... 330/9, 255
See application file for complete search history.

(56) References Cited

U.S. PATENT DOCUMENTS

| 8,054,134 | B2* | 11/2011 | Huang | H03F 3/45 330/255 |
| 8,159,302 | B2* | 4/2012 | Yeh | H03F 1/0205 330/255 |
| 8,193,861 | B2* | 6/2012 | Tsuzaki | H03F 3/3022 330/253 |
| 8,222,957 | B2* | 7/2012 | Kato | H03F 3/45 330/253 |
| 8,395,448 | B2* | 3/2013 | Ivanov | H03F 1/086 330/255 |

\* cited by examiner

*Primary Examiner* — Henry Choe
(74) *Attorney, Agent, or Firm* — Winston Hsu; Scott Margo

(57) ABSTRACT

A signal amplifying circuit with noise suppression function includes a first circuit module and a second circuit module. The first circuit module includes a current source and a switch. The current source is connected to an input stage for inputting a current. The switch is connected to a first output terminal and adapted to switch the input stage and the first output terminal according to a chopping frequency. The second circuit module includes an equivalent capacitance disposed between an output stage and a second input terminal connected to the first output terminal. The signal amplifying circuit controls current volume of the current source and capacity value of the equivalent capacitance to accordingly adjust an interior frequency bandwidth of the signal amplifying circuit, and the interior frequency bandwidth is smaller than the chopping frequency and greater than an input signal of the input stage.

7 Claims, 2 Drawing Sheets

SIGNAL AMPLIFYING CIRCUIT WITH NOISE SUPPRESSION FUNCTION

BACKGROUND OF THE INVENTION

1. Field of the Invention

The present invention relates to a signal amplifying circuit, and more particularly, to a signal amplifying circuit capable of effectively suppressing noise by low speed of electric charge/discharge.

2. Description of the Prior Art

Chopping technology utilizes the switch to change orientation of the direct current (DC) offset and the low frequency noise relative to the signal, the direct current offset and the low frequency noise are transformed into high frequency interference, and the low-pass filter can be applied to eliminate the interference accordingly. An interior frequency bandwidth of the conventional chopping amplifier is greater than the chopping frequency to avoid insufficient settling time, and the chopping frequency has to be greater than signal frequency according to manufacture of the low-pass filter, so the conventional chopping amplifier has a drawback of high energy consumption. Besides, the low-pass filter of the conventional chopping amplifier is an internal capacitance of the circuit or an independent capacitance outside the circuit, which spends expensive material and manufacturing cost.

SUMMARY OF THE INVENTION

The present invention provides a signal amplifying circuit capable of effectively suppressing noise by low speed of electric charge/discharge for solving above drawbacks.

According to the claimed invention, a signal amplifying circuit with noise suppression function is disclosed. The signal amplifying circuit includes a first circuit module and a second circuit module. The first circuit module has an input stage and a first output terminal. The first circuit module includes a current source connected to the input stage and adapted to input a current, and a switch connected to the first output terminal and adapted to switch positive poles and negative poles of the input stage and the first output terminal according to a chopping frequency. The second circuit module has an output stage and a second input terminal connected to the first output terminal. The second circuit module includes an equivalent capacitance disposed between the output stage and the second input terminal, an interior frequency bandwidth of the signal amplifying circuit is adjusted by controlling a current volume of the current source and a capacity value of the equivalent capacitance accordingly, and the interior frequency bandwidth is smaller than the chopping frequency and greater than an input signal of the input stage.

According to the claimed invention, the chopping frequency is at least 10 times the interior frequency bandwidth.

According to the claimed invention, the first circuit module further includes a first loading component connected to the first output terminal and grounded, the second circuit module further includes a second loading component and a third loading component respectively connected to the equivalent capacitance and grounded.

According to the claimed invention, the signal amplifying circuit decreases the current volume of the current source to reduce the interior frequency bandwidth, or disposes the equivalent capacitance with a high capacity value on the second circuit module to reduce the interior frequency bandwidth.

According to the claimed invention, the interior frequency bandwidth is applied to drive the signal amplifying circuit in slew rate so as to eliminate direct current offset voltage and low frequency noise.

According to the claimed invention, the second input terminal utilizes Miller Compensation to drive the first output terminal in the slew rate while being switched according to the chopping frequency.

The present invention utilizes the applicable chopping frequency and sets the signal amplifying circuit driven in slew rate, so as to reduce the interior frequency bandwidth of the signal amplifying circuit lower than the chopping frequency and greater than frequency of processing signal, and current consumption is averted for power economy. The signal amplifying circuit is driven in slew rate by switch of the positive and negative poles according to the chopping frequency, and the interfering signal of the chopping frequency can be effectively suppressed within a specific range (such as the above-mentioned triangular wave with low amplitude), so that the back end circuit has no need of wide input voltage range to sustain chopping interference with large scale. The signal amplifying circuit of the present invention can effectively suppress the chopping interference, and the back end circuit can be applied to process the signal without linearity effect even though there is no analog filter.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
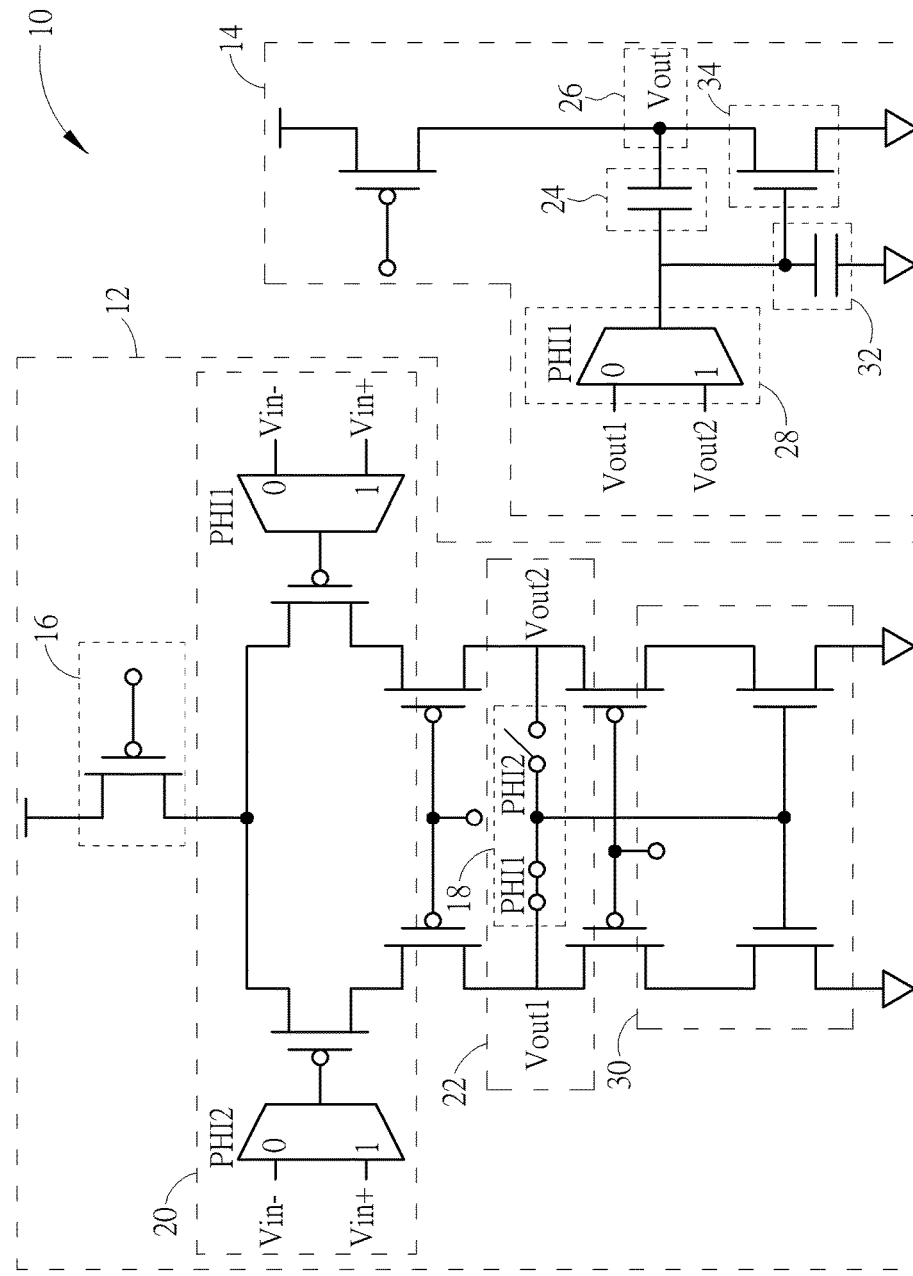
FIG. 1 is a diagram of a signal amplifying circuit with noise suppression function according to an embodiment of the present invention.

Please refer to FIG. 1. FIG. 1 is a diagram of a signal amplifying circuit 10 with noise suppression function according to an embodiment of the present invention. A conventional amplifier circuit is rapidly changed from high to low and outputs square chopping wave with large amplitude. For overcoming interference of the chopping wave effectively, the signal amplifying circuit 10 of the present invention can conspicuously suppress speed of electric charge/discharge, constraint of slew rate is utilized to transform its outputting wave into triangular wave with low amplitude, and interference amplitude can be effectively decreased, so that another circuit back the signal amplifying circuit 10 is no need of wide range of the input voltage and design of an extra filter.

The signal amplifying circuit 10 is mainly composed of a first circuit module 12 and a second circuit module 14. A buffer circuit can be optionally disposed between the first circuit module 12 and the second circuit module 14, which depends on design demand. The first circuit module 12 includes a current source 16 and a switch 18. The current source 16 is connected to an input stage 20 of the first circuit module 12 and adapted to input current into the signal amplifying circuit 10. The switch 18 is connected to a first output terminal 22 of the first circuit module 12 and adapted to switch positive poles and negative poles of the input stage 20 and the first output terminal 22 according to a chopping frequency of the signal amplifying circuit 10. An equivalent capacitance 24 of the second circuit module 14 is disposed between the output stage 26 and the second input terminal 28, and the second input terminal 28 is connected to the first output terminal 22. The first circuit module 12 further includes a first loading component 30 connected to the first output terminal 22 and grounded. The second circuit module 14 further includes a second loading component 32 and a third loading component 34 respectively connected to the equivalent capacitance 24 and grounded.

The present invention can adjust the interior frequency bandwidth of the signal amplifying circuit 10 by controlling an outputting current volume of the current source 16 and a capacity value of the equivalent capacitance 24 accordingly, so the interior frequency bandwidth is smaller than the chopping frequency and greater than an input signal of the input stage 20. For example, the chopping frequency of the signal amplifying circuit 10 of the present invention is preferably designed as 10 times the interior frequency bandwidth, which means the interior frequency bandwidth is tiny; then, the second input terminal 28 makes use of Miller Compensation and the equivalent capacitance 24 with high capacity value, the first output terminal 22 can be driven in slew rate according to switch of the chopping frequency, so as to eliminate direct current (DC) offset voltage and low frequency noise of the signal amplifying circuit 10.

Figure 2:
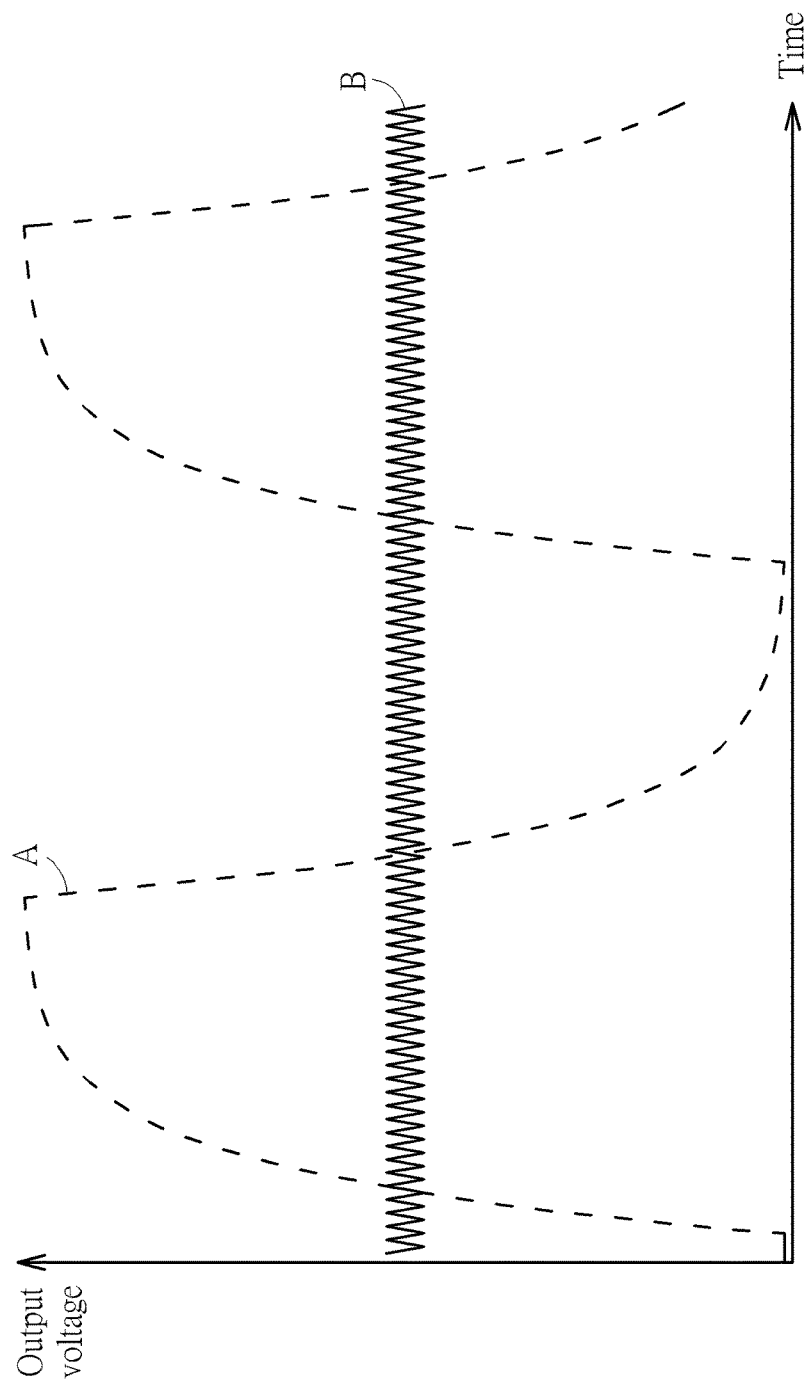
FIG. 2 is a signal simulating diagram of the signal amplifying circuit 10 shown in FIG. 1.

Please refer to FIG. 2. FIG. 2 is a signal simulating diagram of the signal amplifying circuit 10 shown in FIG. 1. The wave A illustrated by a dotted line represents interference chopping wave of the conventional amplifier circuit, and the wave B illustrated by an unbroken line represents the outputting chopping wave of the signal amplifying circuit 10 of the present invention. By the signal simulation analysis of the present invention, the interior frequency bandwidth of the conventional amplifier circuit equals 100 KHz, duty cycle equals ΔT and interference chopping wave equals the wave A shown in FIG. 2 while the chopping frequency is selected as 10 KHz. In order to plenty decrease the of electric charging/discharging speed of the signal amplifying circuit 10, the present invention can optionally set the interior frequency bandwidth of the signal amplifying circuit 10 as 1 KHz (which means the interior frequency bandwidth is ten percent of the chopping frequency, preferably), and the duty cycle of the signal amplifying circuit 10 equals 100 ΔT accordingly. Parameter setting of the present invention is not limited to the above-mentioned embodiment, and depends on design demand. Therefore, change state period of the signal amplifying circuit 10 may be hundred times the change state period of the conventional amplifier circuit, the output voltage of the signal amplifying circuit 10 is still driven in slew rate according to switch of the chopping frequency before transient, and the outputting chopping wave of the signal amplifying circuit 10 can be formed as the triangular wave with low amplitude shown in FIG. 2.

The present invention can decrease the interior frequency bandwidth of the signal amplifying circuit 10 by controlling the outputting current volume of the current source 16 and the capacity value of the equivalent capacitance 24, such as decreasing the outputting current volume of the current source 16 and/or disposing the equivalent capacitance 24 with high capacity value on the second circuit module 14, so that the duty cycle of the signal amplifying circuit 10 can be plenty enlarged. For example, the outputting current volume of the current source 16 is reduced as ten percent of an initial value (a predetermined outputting current of the conventional amplifier circuit), the capacity value of the equivalent capacitance 24 is enlarged as ten times the initial value (the capacity value of the conventional amplifier circuit), and the duty cycle of the signal amplifying circuit 10 can be enlarged hundred times the original. Scales of the outputting current volume of the current source 16 and the capacity value of the equivalent capacitance 24 are not limited to the above-mentioned embodiment, which depends on actual demand.

Further, the present invention can steady the outputting current volume of the current source 16 and enlarge the capacity value of the equivalent capacitance 24 hundred times the original, or steady the capacity value of the equivalent capacitance 24 and reduce the outputting current volume of the current source 16 as one percent of the initial value. Any method capable of adjusting the duty cycle (or the interior frequency bandwidth) of the signal amplifying circuit 10 to a predetermined magnifying factor by the product of variation of the outputting current volume of the current source 16 and adjustment of the capacity value of the equivalent capacitance 24 conforms to design demand of the signal amplifying circuit 10 in the present invention.

The present invention utilizes the applicable chopping frequency and sets the signal amplifying circuit driven in slew rate, so as to reduce the interior frequency bandwidth of the signal amplifying circuit lower than the chopping frequency and greater than frequency of processing signal, and current consumption is averted for power economy. The signal amplifying circuit is driven in slew rate by switch of the positive and negative poles according to the chopping frequency, and the interfering signal of the chopping frequency can be effectively suppressed within a specific range (such as the above-mentioned triangular wave with low amplitude), so that the back end circuit has no need of wide input voltage range to sustain chopping interference with large scale. The signal amplifying circuit of the present invention can effectively suppress the chopping interference, and the back end circuit can be applied to process the signal without linearity effect even though there is no analog filter.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A signal amplifying circuit with noise suppression function, the signal amplifying circuit comprising:
   a first circuit module having an input stage and a first output terminal, the first circuit module comprising:
      a current source connected to the input stage and adapted to input a current; and
      a switch connected to the first output terminal and adapted to switch positive poles and negative poles of the input stage and the first output terminal according to a chopping frequency; and
   a second circuit module having an output stage and a second input terminal connected to the first output terminal, the second circuit module comprising an equivalent capacitance disposed between the output stage and the second input terminal, an interior frequency bandwidth of the signal amplifying circuit being adjusted by controlling a current volume of the current source and a capacity value of the equivalent capacitance accordingly, and the interior frequency bandwidth being smaller than the chopping frequency and greater than an input signal of the input stage.

2. The signal amplifying circuit of claim 1, wherein the chopping frequency is at least 10 times the interior frequency bandwidth.

3. The signal amplifying circuit of claim 1, wherein the first circuit module further comprises a first loading component connected to the first output terminal and grounded, the second circuit module further comprises a second loading component and a third loading component respectively connected to the equivalent capacitance and grounded.

4. The signal amplifying circuit of claim 1, wherein the signal amplifying circuit decreases the current volume of the current source to reduce the interior frequency bandwidth.

5. The signal amplifying circuit of claim 1, wherein the equivalent capacitance with a high capacity value is disposed on the second circuit module to reduce the interior frequency bandwidth.

6. The signal amplifying circuit of claim 1, wherein the interior frequency bandwidth is applied to drive the signal amplifying circuit in slew rate so as to eliminate direct current offset voltage and low frequency noise.

7. The signal amplifying circuit of claim 6, wherein the second input terminal utilizes Miller Compensation to drive the first output terminal in the slew rate while being switched according to the chopping frequency.

* * * * *